United States Patent [19]
Morrison et al.

[11] Patent Number: 6,054,863
[45] Date of Patent: *Apr. 25, 2000

[54] SYSTEM FOR TESTING CIRCUIT BOARD INTEGRITY

[75] Inventors: Thomas Morrison, Pleasant Valley, N.Y.; Siegfried Geyer, Nufringen, Germany; Charles J. Hendricks, Wappingers Falls, N.Y.; Klaus Probst, Herrenberg, Germany

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/710,130

[22] Filed: Sep. 11, 1996

[51] Int. Cl.[7] ............................ G01R 31/02; H01H 31/02
[52] U.S. Cl. ................................. 324/537; 324/754
[58] Field of Search ................... 371/20, 22.3; 324/537, 324/754, 678, 73.1, 761, 72.5, 677

[56] References Cited

U.S. PATENT DOCUMENTS

| | | | |
|---|---|---|---|
| 4,173,736 | 11/1979 | Adams | 324/51 |
| 4,429,271 | 1/1984 | Doubek et al. | 324/60 |
| 4,443,756 | 4/1984 | Lightbody | 324/761 |
| 4,565,966 | 1/1986 | Burr et al. | 324/73 |
| 4,646,299 | 2/1987 | Schinabeck | 371/20 |
| 4,661,768 | 4/1987 | Carusillo | 324/60 |
| 4,908,576 | 3/1990 | Jackson | 371/22.3 |
| 5,187,430 | 2/1993 | Marek et al. | 324/66 |
| 5,266,901 | 11/1993 | Woo | 324/537 |
| 5,274,334 | 12/1993 | Mills | 324/678 |
| 5,357,191 | 10/1994 | Grace | 324/754 |
| 5,363,048 | 11/1994 | Modlin et al. | 324/519 |
| 5,402,072 | 3/1995 | Chiang et al. | 324/537 |
| 5,438,272 | 8/1995 | Craig et al. | 324/537 |

OTHER PUBLICATIONS

IBM Technical Disclosure Bulletin, Jun., 1995 vol. 38 No. 6, pp. 507–508 J. Boyette and J. C. Mahlbacher Method for Eliminating Common Defects from Capacitance Opens Shorts Data.

Primary Examiner—Josie Ballato
Assistant Examiner—Russell M. Kobert
Attorney, Agent, or Firm—DeLio & Peterson, LLC; Robert Curcio; Aziz M. Ahsan

[57] ABSTRACT

A system for testing circuit boards comprising a probe network having a plurality of probes wherein each probe is adapted for contacting an end of a corresponding circuit board network and wherein each probe and network define a node having an address. The system further comprises a control device that includes a node address generator and a timing circuit having an output for outputting a pulse to the node having the address generated by the node address generator and for coupling the remaining nodes to electrical ground. The system further comprises a comparator for comparing the pulse outputted by the timing circuit to predetermined data.

14 Claims, 3 Drawing Sheets

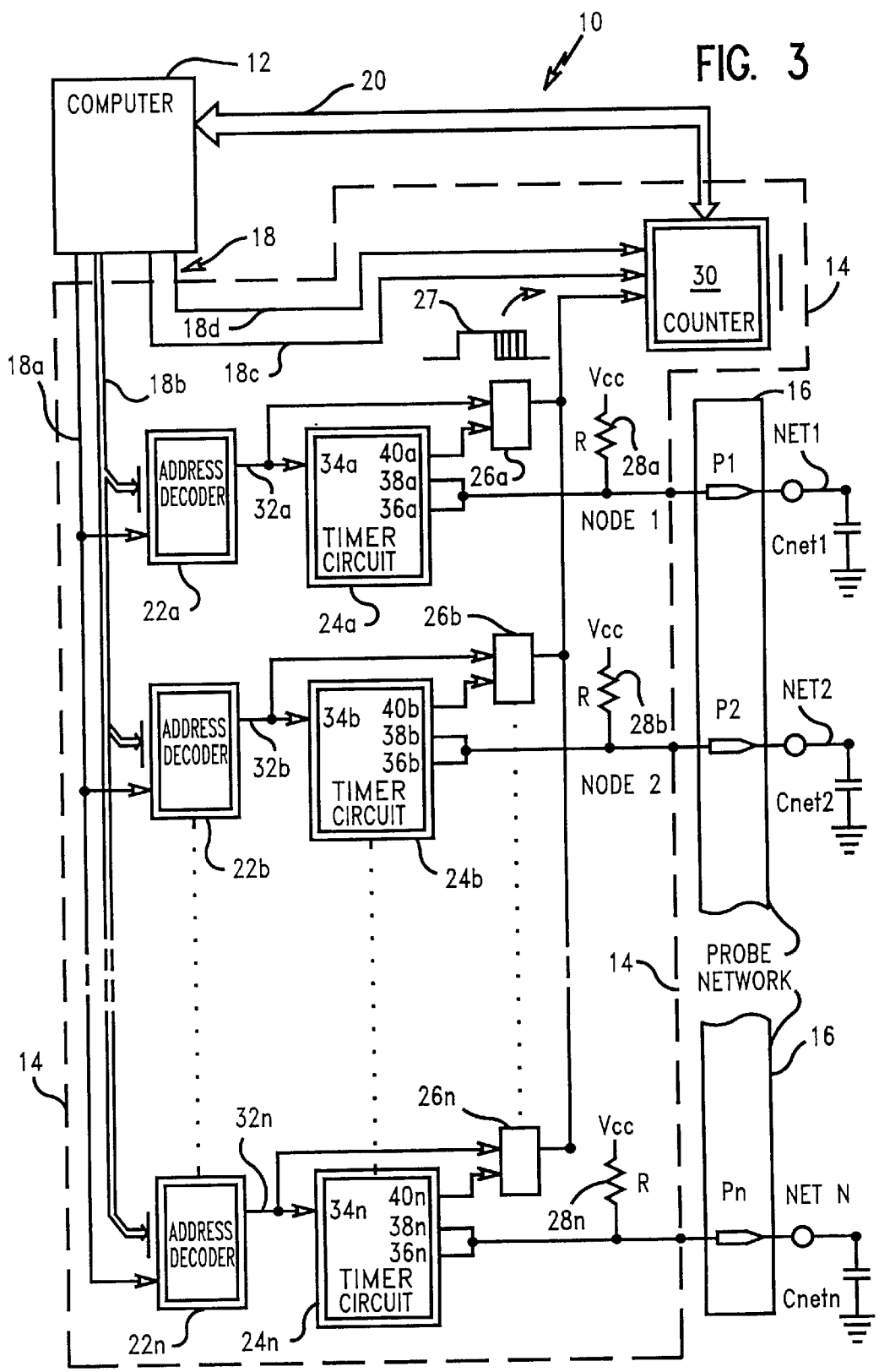

SYSTEM FOR TESTING CIRCUIT BOARD INTEGRITY

BACKGROUND OF THE INVENTION

1. Field of the Invention

The present invention relates generally to detecting defects in circuit boards or integrated circuit chip carriers.

2. Problem to be Solved

Circuit boards and integrated circuit (IC) chip carriers, such as single chip module (SCM), multi-chip module (MCM) and hybrid chip carriers are typically used for mounting and interconnecting electronic components in most electronic equipment. Such circuit boards or IC chip carriers usually include metal interconnections, voltage planes, a ground plane and dielectric materials such as ceramic, glass ceramic, silicon-oxide, polymer and/or epoxy glass. The circuit boards also include a plurality of interconnection networks ("nets"). Each net may be distributed either across a single layer or across multiple layers within the circuit board.

As packaging density in such boards continues to increase, the metal interconnections which comprise each interconnection network are decreasing in size and are being spaced closer together. Such continual miniaturization of the metal interconnections within the circuit boards or chip carriers results in an increase in the probability of a variety of defects. For example, the points of a conductor network that should be connected together may have one (or more) discontinuities in the conductor path(s). This results in an "open circuit" condition having substantially infinite resistance between certain sections of the network. A further defect occurs when two independent conductor networks or conductor areas that are supposed to have no electrical connection and therefore substantially infinite internet resistance, in fact display an unacceptable, low value of internet resistance. This is commonly referred to as a "short circuit". In addition, a conductive pathway may be defective because it displays one or more sections having resistances which exceed an acceptable level. This defect is referred to as a "resistive fault". In a properly manufactured high-density passive board, the resistance between terminals of a common conductor network is normally in the range of from a few milliohms to many ohms. This resistance is dependent on the length and cross-section of the conductors. Furthermore, the resistance between independent networks should approach infinity. This resistance typically exceeds 100 megohms.

A necessary step in the manufacture of high-density substrates, chip carriers, and passive boards is to test the proper continuity and isolation of all nets before any electronic components are mounted. Continuity testing measures relatively low resistance within particular networks. Open circuits and resistive faults are thus typical defects which are found in continuity testing. Isolation testing measures the expected high resistance levels that should exist between conductors. Short circuits are typical defects which are found when conducting isolation testing.

A common continuity and isolation test method uses cluster probes which match and contact test pads on the substrate surface. By controlling the switching matrix, resistance from a network under test to all other networks in the substrate can be measured. This is a relatively fast testing method, however, it lacks flexibility. Substrates with different designs usually require different cluster probes or "bed-of-nail" fixtures. In addition, complexity and long lead-time to produce custom cluster probes make this technique costly especially for early manufacturing where product design may not be finalized.

Another isolation test is the so called point-to-point or single probe testing wherein two moving probes are used on an X-Y positioning mechanism. This flexible probing method can perform individual tests between all possible pairs of nets. In this method, testing of passive substrates is accomplished by using moving probes in a series of two-point resistance measurements. In this manner, the continuity of individual nets may be verified. This method allows a series of one-point measurements to be made to determine the capacitance of a network relative to a reference plane or indicate short-circuits between nets through excessive internet capacitance. While this approach has great flexibility, it suffers from several severe practical difficulties which limit its effectiveness and speed. These include a need for switching between resistance and capacitive test modes, lengthy cycle times, difficulty of detecting a low-capacitance net shorted to a high-capacitance net when testing the high capacitance net, and an inability to distinguish between a high-resistance short to a net and a leakage path directly to ground. Furthermore, this method relies on simple scalar matching of capacitance values during the defect isolation process. In this manner, the continuity of nets which display excessive capacitance is checked against a potentially long list of other nets showing similar capacitance.

Bearing in mind the problems and deficiencies of conventional processes and systems for testing circuit boards, it is an object of the present invention to provide a new and improved system for testing the integrity of circuit boards.

It is another object of the present invention to provide a new and improved system for identifying defects in circuit boards that requires relatively fewer components than conventional testing systems.

It is a further object of the present invention to provide a new and improved system for testing the integrity of interconnection networks on circuit boards or unpopulated chip carriers in relatively less time than conventional testing systems.

Still other objects and advantages of the invention will in part be obvious and will in part be apparent from the specification.

SUMMARY OF THE INVENTION

The above and other objects, which will be apparent to those skilled in the art, will be achieved in the present invention which is directed to, in a first aspect, a system for testing circuit boards, comprising:

a probe network having a plurality of probes, each probe adapted for contacting an end of a corresponding circuit board network, each probe and network defining a node having an address; and a control device including,
    a node address generator,
    a timing circuit having an output for outputting a pulse to the node having the address generated by the node address generator and coupling the remaining nodes to electrical ground; and
    a comparator for comparing the pulse to predetermined data.

In a related aspect, the present invention is directed to a system for testing circuit boards, comprising:

a probe network having a plurality of probes, each probe adapted for contacting an end of a corresponding circuit board network, each probe and network defining a node having an address; and a control device including,
  a node address generator,
  a plurality of timing circuits, each timing circuit corresponding to one of the nodes, each timing circuit having an enable signal input and an output coupled to a corresponding one of the nodes, each timing circuit outputting a pulse upon receipt of the enable signal and coupling the corresponding nodes to ground potential when no enable signal is received;
  a plurality of address decoders, each decoder corresponding to one of the timing circuits and having an input for receiving the node addresses generated by the node address generator, each decoder having a predetermined address stored therein that is the same as the node address of the node to which the output of the corresponding timing circuit is coupled, each decoder outputting an enable signal when the decoder receives a node address from the node address generator that is the same as the predetermined address;
  a comparator for comparing the pulse to predetermined data; and
  a data storage device for storing the predetermined data.

In a further aspect, the present invention is directed to a system for testing circuit boards, comprising:

a probe network having a plurality of probes, each probe adapted for contacting an end of a corresponding circuit board network, each probe and network defining a node having an address; and a control device including,
  a node address generator,
  a plurality of timing circuits, each timing circuit corresponding to one of the nodes, each timing circuit having an enable signal input and an output coupled to a corresponding one of the nodes, each timing circuit outputting a pulse upon receipt of the enable signal and coupling the corresponding node to ground potential when no enable signal is received;
  a plurality of address decoders, each decoder corresponding to one of the timing circuits and having an input for receiving the node addresses generated by the node address generator, each decoder having a predetermined address stored therein that is the same as the node address of the node to which the output of the corresponding timing circuit is coupled, each decoder outputting an enable signal when the decoder receives a node address from the node address generator that is the same as the predetermined address;
  a plurality of resistors, each resistor being coupled between a power source and the output of a corresponding timing circuit, the pulse width of the pulse outputted by each timing circuit being determined by the product of the resistance of the corresponding resistor and a capacitance of the network forming the node that is coupled to the output of the corresponding timing circuit;
  a data storage device for storing predetermined pulse data; and
  a comparator for comparing the pulse to the predetermined pulse data.

BRIEF DESCRIPTION OF THE DRAWINGS

The features of the invention are believed to be novel and the elements characteristic of the invention are set forth with particularity in the appended claims. The figures are for illustration purposes only and are not drawn to scale. the invention itself, however, both as to organization and method of operation, may best be understood by reference to the detailed description which follows taken in conjunction with the accompanying drawings in which:

FIG. 3 is a schematic diagram of the system of FIG. 2.

DESCRIPTION OF THE PREFERRED EMBODIMENTS

In describing the preferred embodiment of the present invention, reference will be made herein to FIGS. 1–3 of the drawings in which like numerals refer to like features of the invention.

Figure 1:
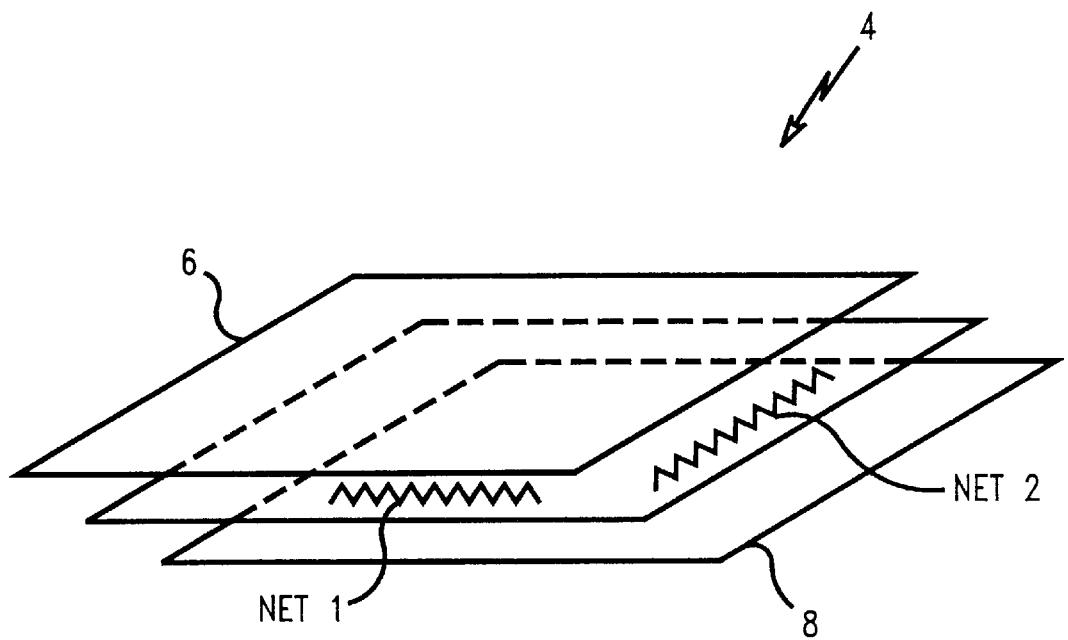
FIG. 1 is a perspective view of an unpopulated high-density circuit board.

FIG. 1 shows an exemplary board used for electronic component packaging. Circuit board 4 is a multi-layer circuit board that is unpopulated, i.e. electrical components have not yet been placed on the board. Circuit board 4 comprises power plane 6, ground plane 8 and interconnection networks ("nets") NET1 and NET2. Each net may be distributed either across a single layer or across multiple layers within the circuit board. Although FIG. 1 shows only two (2) nets, it is to be understood that circuit board 4 has many nets and that the simplicity of circuit board 4, as shown in FIG. 1, facilitates description of the system of the present invention.

Figure 2:
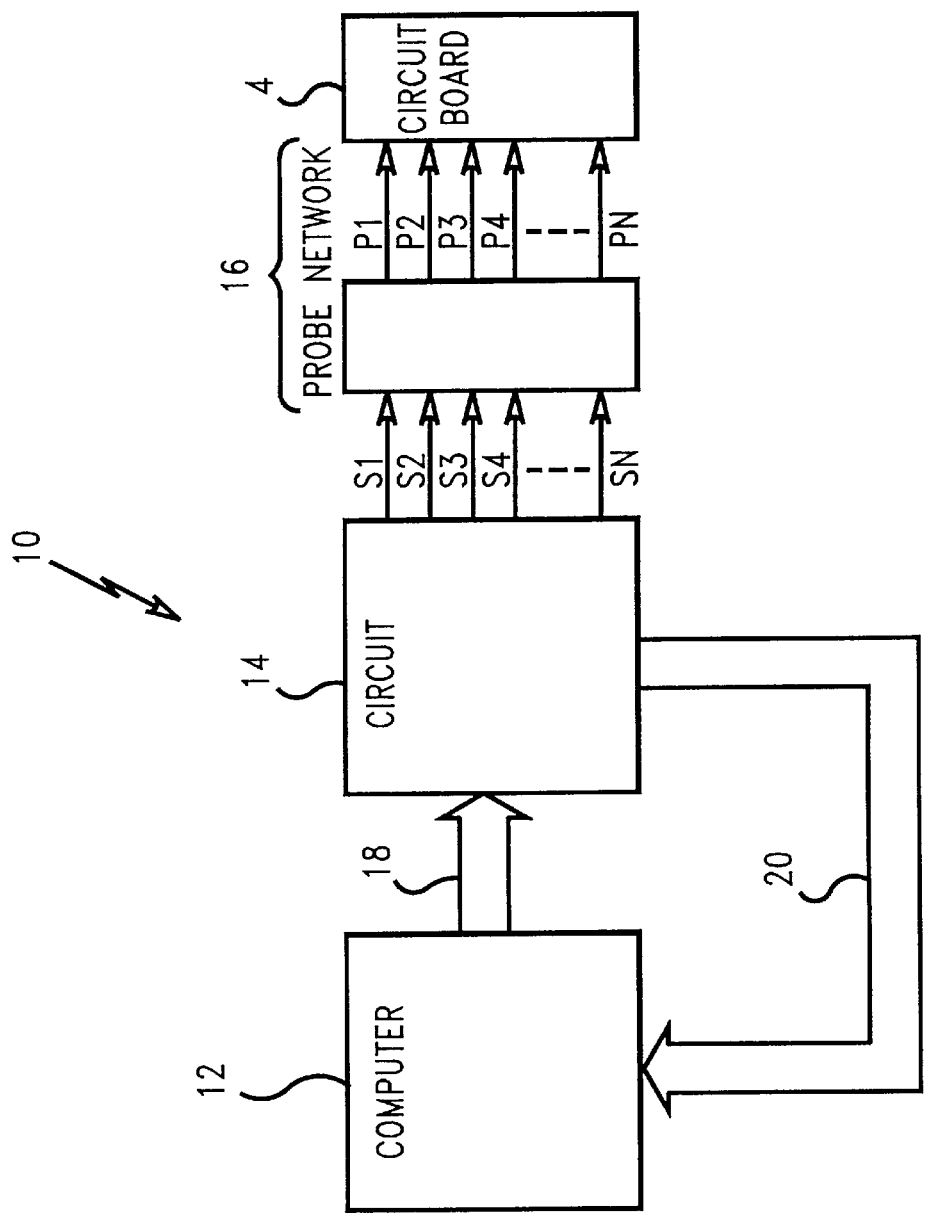
FIG. 2 is a block diagram of the testing system of the present invention.

FIG. 2 shows a block diagram of testing system 10 of the present invention. System 10 comprises computer or microprocessor 12, circuit 14, probe network 16 and circuit board 4 that is to be tested. Probe network 16 is a cluster-type probe network comprising a plurality of individual probes $P_1$–$P_N$ wherein each individual probe corresponds to a net of circuit board 4. For example, if circuit board 4 has N nets, then probe network 16 has N probes. Probe $P_N$ contacts the Nth net of circuit board 4. Thus, all nets are contacted simultaneously by probes $P_1$–$P_N$. Circuit 14 outputs test signals $S_1$–$S_N$ which are inputted into probe network 16. Each test signal $S_1$–$S_N$ corresponds to an individual probe $P_1$–$P_N$, respectively. Circuit 14 receives data from computer 12 over data bus 18 which identifies the particular net of board 4 that is to be tested. Circuit 14 outputs data to bus 20 which pertains to the test signals $S_1$–$S_N$. The data on bus 20 is inputted into computer 12. Computer 12 compares the data received from circuit 14 with stored reference data. This comparison function determines whether a circuit board is defective. A monitor (not shown) may be used with computer 12 to allow the user to quickly ascertain whether a circuit board is defective. System 10 will now be discussed in detail.

Referring to FIG. 3, circuit 14 comprises address decoders 22a–n, timer circuits 24a–n, logic AND gates 26a–n, resistors 28a–n and counter circuit 30. Computer 12 outputs data to circuit 14 via data bus 18. Data bus 18 comprises gating signal 18a, address data 18b, counter-enable signal 18c and system clock 18d. Gating signal 18a and address data 18b are inputted into every address decoder 22a–n. Enable signal 18c and system clock signal 18d are inputted into counter 30. Probe network 16 defines a plurality of nodes designated by Nodes 1-N. Each node corresponds to a particular probe of probe network 16. For example, Node 1 corresponds to probe $P_1$, Node 2 corresponds to probe $P_2$ and Node N corresponds to probe $P_N$.

In the ensuing discussion, particular signals are referred to as having logic "1" or logic "0" levels. Although, certain functions of system 10 are implemented when a particular signal has a stated logic level, it is to be understood that simple modifications may be made so the functions of system 10 can be implemented when the particular signals have logic levels that are opposite to the stated logic levels.

Referring to FIG. 3, each node has a corresponding node address that is decoded by a corresponding address decoder. For example, the address for Node 1 is decoded by address decoder 22a. Similarly, the address for Node N is decoded by address decoder 22n. Each address decoder 22a–n simultaneously receives gating signal 18a and address data 18b from computer 12. Each address decoder 22a–n contains a pre-programmed node address and compares the incoming address data 18b to this preprogrammed node address. If address data 18b matches the preprogrammed node address and gating signal 18a has a logic "1" level, each address decoder 22a–n outputs a logic "1" trigger signal 32a–n, respectively. If address data 18b does not match the preprogrammed node address, each address decoder 22a–n outputs a logic "0" gating signal. In a preferred embodiment, computer 12 is programmed with software that generates node addresses sequentially. Thus, only one address decoder 22a–n at a time outputs a logic "1" trigger signal 32a–n. Each of the remaining decoders outputs a trigger signal having a logic level that disables the corresponding timer circuit. When a timer circuit is disabled, the node corresponding to that timer circuit is coupled through the timer circuit to electrical ground.

Each timer circuit 24a–n has a trigger input 34a–n, discharge terminal 36a–n, external capacitor terminal 38a–n and output 40a–n, respectively. In a preferred embodiment, each timer-circuit is a CMOS type timer. Each discharge terminal and external capacitor terminal are coupled to a corresponding node. For example, discharge terminal 36a and external capacitor terminal 38a are coupled to Node 1. Each resistor 28a–n is coupled between the supply voltage $V_{CC}$ and a node. In a preferred embodiment, $V_{CC}$ is about 15 volts d.c. and each resistor has a resistance between about 100 KΩ and 2MΩ ohms. The actual resistance of each resistor 28a–n depends on the size of the circuit board being tested and the number of nodes and probes utilized in system 10. Each resistor 28a–n is coupled to NET1-N, respectively, through probes $P_{1-N}$, respectively. The capacitance of each net $C_{NET1-N}$ and resistors 28a–n, respectively, form a plurality of R/C (resistor/capacitor) timing circuits. Since each discharge terminal 36a–n and external capacitor terminal 38a–n of each timer 24a–n, respectively is coupled to a Node 1-N, respectively, each R/C timing circuit becomes the R/C timing circuit for a corresponding timer circuit 24a. When each trigger input 34a–n of timer circuits 24a–n, respectively, receives a trigger signal 32a–n, respectively, a pulse 27 is outputted at output terminals 40a–n, respectively.

The presence and duration of the pulse outputted at output terminals 40a–n of each timer circuit 24a–n, respectively, depends upon the R/C time constant of each R/C timing circuit. Specifically, the pulse width of each pulse outputted at outputs 40a–n is proportional to the net capacitance $C_{NET1-N}$, respectively. The pulses outputted at output terminals 40a–n are inputted into AND gates 26a–n, respectively. Trigger signals 32a–n are also inputted into AND gates 26a–n, respectively. Thus, when trigger signals 32a–n have a logic "1" level, the pulses outputted at terminals 40a–n, are gated into input 31 of counter circuit 30. The function of counter 30 will be discussed in detail below.

As stated above, the width of each pulse outputted at output terminals 40a–n of timers 24a–n is proportional to the capacitance of each net, i.e. $C_{NET1-N}$, respectively. Thus, the pulse width of each pulse outputted at the timer circuit output terminals 40a–n determines whether the net under test has an open circuit or a short circuit. Counter 30 digitizes the incoming pulse into an m-bit word. The m-bit word is transferred to computer 12 via data bus 20 when counter 30 is enabled by computer 12 via counter-enable signal 18c. Computer 12 compares the digitized pulse width to predetermined data stored therein. The predetermined data may consists of engineered data, e.g. pulse width data based on circuit board design characteristics or data based on tests performed on circuit boards having no defects. System 10 can also generate the predetermined data by a "self learn" process on a "golden part", i.e. a circuit board or card having known defects or no defects. Predetermined tolerances may be incorporated into the predetermined data stored in computer 12. Table I below illustrates the characteristics of the width of the pulse outputted from the timer circuits and the corresponding circuit board condition.

TABLE I

| Pulse Width | Circuit Board Condition |
| --- | --- |
| 1. Reference Value ± Tolerance | Good Network (Single end contacted) |
| 2. Pulse Appears When No Pulse Should Be Present | Open Node In A Multi-Point Contacted Net |
| 3. No Pulse Appears When A Pulse Should Be Present | Short/Leakage To A Contacted Net |
| 4. Pulse Width > Reference Value | Short To A Non Contacted "to" Net |
| 5. Pulse Width < Reference Value | Open In A Single Node Contacted Net |
| 6. Pulse Width < Open Probe Value | Probe Wire Discontinuity |

Theory of Operation

The first step in testing the integrity of a circuit board is to attach probe network 16 to the circuit board such that one probe contacts one end of a net. The appropriate software program is then chosen for testing the circuit board. Preferably, the program allows the user to input data in order to tailor the integrity test to specific requirements. For purposes of this discussion, it is assumed that a software program is chosen that implements a normal integrity test, i.e. every net of the circuit board is tested. Preferably, the software program also contains the information in Table I shown above. Next, the electronic circuit supply voltages are then activated. The user then initiates the test via a key board or other control that is connected to computer 12. The software program generates sequentially the addresses of Nodes 1-N and outputs the addresses over address bus 18b. Each decoder 22a has a corresponding node address stored therein. When an address on data bus 18b matches the address stored in a particular decoder, that decoder outputs a trigger signal (trigger signals 32a–n in FIG. 3) that is inputted into the trigger input (trigger inputs 34a–n in FIG. 3) of the corresponding timer circuit. The remaining decoders do not output a trigger signal thereby disabling the remaining timer circuits. All unaddressed nodes are coupled to electrical ground to form a reference plane for the tested net. The trigger signal outputted from the decoder is also inputted into the AND gate (AND gates 26a–n in FIG. 3). Each timer circuit 24a–n, upon receiving a trigger signal from a corresponding decoder, outputs a pulse (output terminals 40a–n) that is inputted into the corresponding AND gate along with the trigger signal. Thus, the output pulse of the timer circuit is gated into counter circuit 30.

Counter circuit 30 measures the pulse width and digitizes the pulse width into an m-bit word. The m-bit is then transferred to computer 12 via data bus 20. Computer 12 compares the digitized pulse width to the stored reference data of Table I.

Thus, system 10 of the present invention provides significant advantages over the conventional test systems discussed above. Specifically, system 10 utilizes fewer probes than the conventional cluster probe or "bed of nails" system since system 10 requires that only one end of the net under test be contacted by a probe. Furthermore, the probe network 16 does not have to be reconfigured to test circuit boards of varying designs. It is apparent that system 10 costs significantly less to fabricate and maintain. System 10 also offers significant advantages over the conventional serial probe test system discussed above. The test speed of the conventional serial probe test system is severally limited due to the mechanical movements of the test probe. Typically, the test speed of the conventional serial probe test system is about 100 tests/minute. On the other hand, system 10 of the present invention implements tests at electronic speeds of about 50 $\mu$s/test.

System 10 of the present invention provides leakage detection capability that is significantly improved over conventional test systems, especially the conventional "capacitance only" testing. System 10 also provides a resistive continuity test if all net points are contacted. The typical accuracy of the timer circuits 24a–n, about ±2%, is adequate for implementing non-parametric "go/no-go" shorts and continuity tests. The low component count required by system 10, as compared to conventional test matrices, allows the front end circuits to be mounted in close proximity to the test probe. This reduces the interface problems of physically small test probes with large test matrices.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

What is claimed is:

1. A system for testing unpopulated circuit boards, comprising:
   an unpopulated circuit board having a plurality of circuit board networks with network capacitance, and a ground plane;
   a probe network having a plurality of probes, each probe adapted for simultaneously contacting one of said circuit board networks, such that each network under test is contacted by a single probe, each probe and network defining a circuit having a return path through the unpopulated circuit board ground plane, and defining a node having an address; and
   a control device including,
      a node address generator,
      a timing circuit having an output for outputting a pulse with a pulse width, and coupled to a resistor to form an R/C timing circuit with said network capacitance to the node having the address generated by the node address generator and coupling the remaining nodes to electrical ground, and
      a pulse width comparator for comparing said pulse width modified by said network capacitance to predetermined pulse width data.

2. The system as set forth in claim 1 wherein the comparator further comprises a circuit for digitizing the width of the pulse generated by the timing circuit.

3. The system as set forth in claim 1 wherein the control device further comprises an address decoder having an input for receiving the node addresses generated by the node address generator, the address decoder enabling the timing circuit to output a pulse to a node having the address generated by the node address generator.

4. The system as set forth in claim in claim 1 wherein the control device further comprises a data storage device for storing the predetermined data.

5. The system as set forth in claim 1 wherein the timing circuit comprises a plurality of timing circuits, each timing circuit corresponding to one of the nodes, each timing circuit having an enable signal input and an output for transmitting a pulse to the corresponding node upon receipt of the enable signal.

6. The system as set forth in claim 5 wherein the control device comprises a plurality of address decoders, each address decoder corresponding to one of the timing circuits and having an input for receiving the node addresses generated by the node address generator, each decoder having a predetermined address stored therein that is the same as the node address of the node to which the output of the corresponding timing circuit is coupled, each decoder outputting an enable signal when the decoder receives a node address from the node address generator that is the same as the predetermined address.

7. The system as set forth in claim 5 wherein the control device further comprises a digitizing circuit having a plurality of inputs, each input being coupled to the output of a corresponding timing circuit, the digitizing circuit outputting to the comparator circuit a digital representation of the width of the pulse generated by each timing circuit.

8. The system as set forth in claim 5 wherein the control device further comprises a data storage device for storing the predetermined data.

9. The system as set forth in claim 5 further comprising a power supply having an output.

10. The system as set forth in claim 9 further comprising a plurality of resistors, each resistor coupled between the power supply output and the output of one of the timing circuits, the pulse width of the pulse outputted by each timing circuit being determined by the product of the resistance of the resistor and a capacitance of a circuit board network receiving the pulse.

11. The system as set forth in claim 1 further comprising a power supply having an output.

12. The system as set forth in claim 11 further comprising a resistor coupled between the power supply output and the output of the timing circuit, the pulse width of the pulse outputted by the timing circuit being determined from the product of the resistance of the resistor and a capacitance of a circuit board network receiving the pulse.

13. A system for testing unpopulated circuit boards, comprising:
   an unpopulated circuit board having a plurality of circuit board networks with network capacitance and a ground plane;
   a probe network having a plurality of probes, each probe adapted for simultaneously contacting one of said circuit board networks with network capacitance, such that each network under test is contacted by a single probe, each probe and network defining a circuit having a return path through the unpopulated circuit board ground plane, and defining a node having an address; and a control device including,
  a node address generator,
  a plurality of timing circuits, each timing circuit corresponding to one of the nodes, each timing circuit having an enable signal input and an output coupled to a corresponding one of the nodes and coupled to a resistor to form an R/C timing circuit with said network capacitance, each timing circuit outputting a pulse with a pulse width upon receipt of the enable signal and coupling the corresponding nodes to ground potential when no enable signal is received;
  a plurality of address decoders, each decoder corresponding to one of the timing circuits and having an input for receiving the node addresses generated by the node address generator, each decoder having a predetermined address stored therein that is the same as the node address of the node to which the output of the corresponding timing circuit is coupled, each decoder outputting an enable signal when the decoder receives a node address from the node address generator that is the same as the predetermined address;
  a pulse width comparator for comparing said pulse width modified by said network capacitance to predetermined pulse width data; and
  a data storage device for storing the predetermined pulse width data.

14. A system for testing unpopulated circuit boards, comprising:
  an unpopulated circuit board having a plurality of circuit board networks having network capacitance and a ground plane;
  a probe network having a plurality of probes, each probe adapted for simultaneously contacting one of said circuit board networks with network capacitance, such that each network under test is contacted by a single probe, each probe and network defining a circuit having a return path through the unpopulated circuit board ground plane, and defining a node having an address; and
  a control device including,
    a node address generator,
    a plurality of timing circuits, each timing circuit corresponding to one of the nodes, each timing circuit having an enable signal input and an output coupled to a corresponding one of the nodes, each timing circuit outputting a pulse with a pulse width upon receipt of the enable signal and coupling the corresponding node to ground potential when no enable signal is received;
    a plurality of address decoders, each decoder corresponding to one of the timing circuits and having an input for receiving the node addresses generated by the node address generator, each decoder having a predetermined address stored therein that is the same as the node address of the node to which the output of the corresponding timing circuit is coupled, each decoder outputting an enable signal when the decoder receives a node address from the node address generator that is the same as the predetermined address;
    a plurality of resistors, each resistor being coupled between a power source and the output of a corresponding timing circuit, the pulse width of the pulse outputted by each timing circuit being determined by the product of the resistance of the corresponding resistor and a capacitance of the network forming the node that is coupled to the output of the corresponding timing circuit;
    a data storage device for storing predetermined pulse width data, and
    a pulse width comparator for comparing said pulse width to the predetermined pulse width data.

* * * * *

UNITED STATES PATENT AND TRADEMARK OFFICE
CERTIFICATE OF CORRECTION

PATENT NO. : 6,054,863
DATED : April 25, 2000
INVENTOR(S) : Morrison et al.

It is certified that error appears in the above-identified patent and that said Letters Patent is hereby corrected as shown below:

Col. 7, line 16, delete "severally" and substitute therefor

--severely--

In The Claims:
Col. 8, line 10, delete second instance "in claim"

Signed and Sealed this

Tenth Day of April, 2001

Attest:

NICHOLAS P. GODICI

Attesting Officer     Acting Director of the United States Patent and Trademark Office